United States Patent
LaFauci

(12) 
(10) Patent No.: US 6,507,808 B1
(45) Date of Patent: Jan. 14, 2003

(54) HARDWARE LOGIC VERIFICATION DATA TRANSFER CHECKING APPARATUS AND METHOD THEREFOR

(75) Inventor: Peter Dean LaFauci, Holly Springs, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/338,084

(22) Filed: Jun. 23, 1999

(51) Int. Cl.$^7$ .............................................. G06F 17/50
(52) U.S. Cl. .............................. 703/20; 703/14; 703/26; 714/735; 714/736
(58) Field of Search .......................... 703/14, 26, 20; 714/735, 736, 742

(56) References Cited

U.S. PATENT DOCUMENTS

| | | | |
|---|---|---|---|
| 4,801,870 A | 1/1989 | Eichelberger et al. | 324/73 R |
| 5,325,377 A | 6/1994 | Tuttle | 371/67.1 |
| 5,446,395 A | 8/1995 | Goto | 324/763 |
| 5,621,799 A | 4/1997 | Katta et al. | 380/48 |
| 5,666,368 A | 9/1997 | Proulx | 371/27.1 |
| 5,845,106 A | 12/1998 | Stapleton | 395/500 |
| 6,076,180 A * | 6/2000 | Meyer | 714/742 |
| 6,269,467 B1 * | 7/2001 | Chang et al. | 716/1 |

* cited by examiner

Primary Examiner—Kevin J. Teska
Assistant Examiner—T. Phan
(74) Attorney, Agent, or Firm—Carlos Munoz-Bustamante

(57) ABSTRACT

An apparatus and method for hardware logic verification data transfer checking are implemented. Data for transfer is generated in response to a decoded bus transaction instruction using a pseudorandom number generator. The seed for the generator includes a predetermined portion provided to each bus device. The predetermined portion is combined with the address of the target device, obtained from the decoded instruction, to form the seed input to the random number generator. For write transactions, the bus master generates the data to be transferred using the seed, and sends the data to the target. The target independently generates the data by a call to the random number generator and compares the value received via the data transfer with the independently generated value. Similarly, for read transactions, the slave device generates the data to be transferred in response to the read request. The bus master initiating the read independently generates the data value by a call to the pseudorandom number generator, and effects the comparison between the received and independently generated values. If a miscompare occurs, for a bus transaction, a data transfer error has occurred, and is reported.

40 Claims, 4 Drawing Sheets

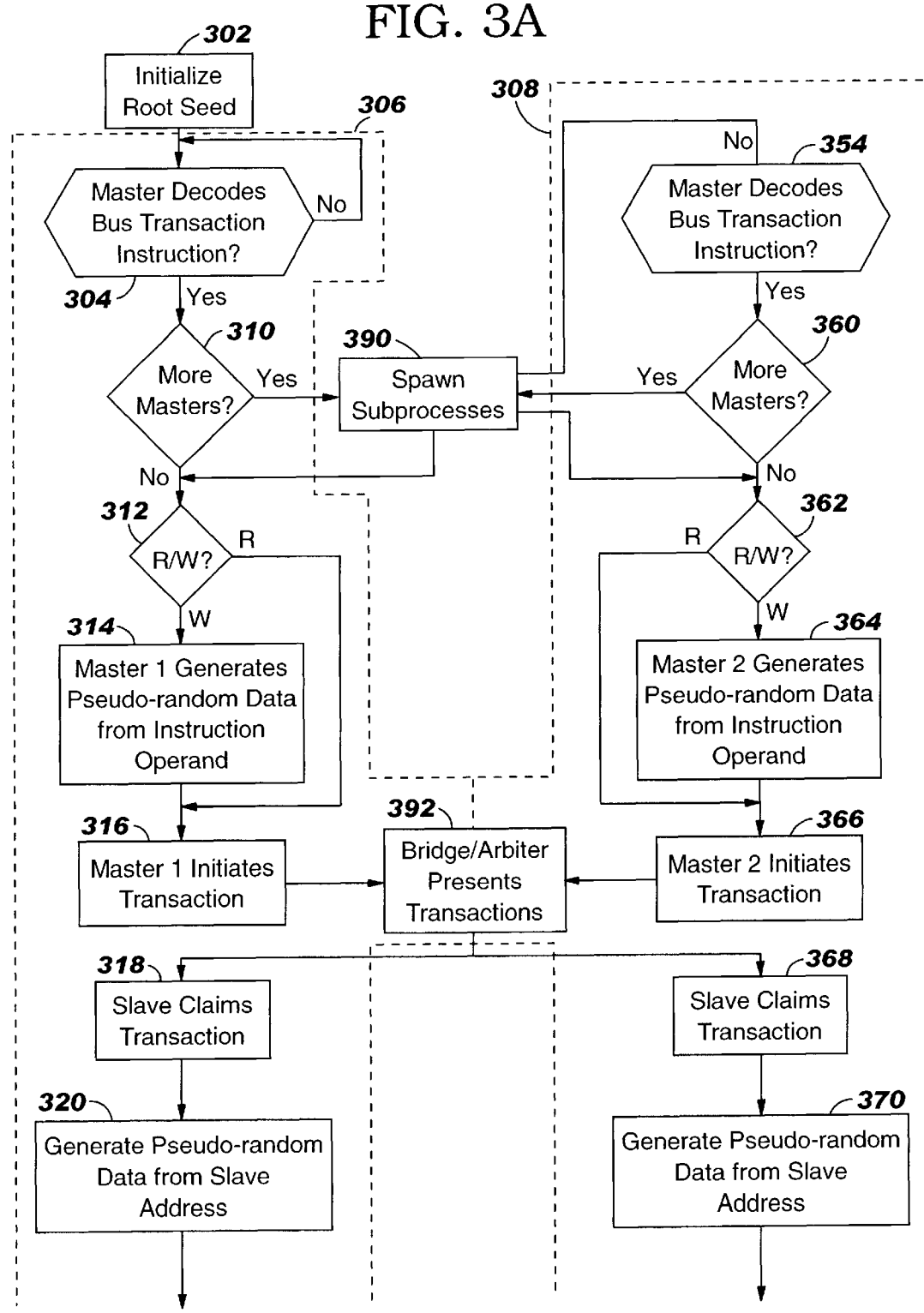

HARDWARE LOGIC VERIFICATION DATA TRANSFER CHECKING APPARATUS AND METHOD THEREFOR

TECHNICAL FIELD

The present invention relates in general to data processing systems, and in particular, to data transfer verification in hardware design simulations.

BACKGROUND INFORMATION

Advances in manufacturing technology, hardware design architectures, and development tools have allowed for the integration of many functions on to a single hardware design, for example, as an "system on a chip," which may be referred to as a core plus application-specific integrated circuit (ASIC) system. In such systems, it is common to integrate many design components using standardized bus interfaces within an integrated design which ultimately represents a single hardware solution. As a consequence of this increased level of function, peripherals that would typically be verified with the processor at the current level, via a system level bus, are now being integrated into the same "silicon" as a processor. As a result, several on-chip bus architectures have been developed to address the on-chip communication between processor cores and peripherals. Along with these bus architectures, simulation tools are being developed to test the function of logic macros with the on-chip bus interfaces.

Verification of logic designs includes testing that data is transferred properly within the system under test. Data is stored in memory elements, for example, caches, static memory, dynamic memory, and other systems storage elements. During the verification process, these memories must be initialized with data to verify read accesses by a master device. Also, the memory devices must be checked during and after a test is executed to ensure that data was properly transferred and stored when master devices perform write cycles within the system.

In simulating logic macros in a hardware system design, test data must be selected for transfer between components within the system. This data also must be varied between tasks, so that a logic design can be thoroughly verified so that all possible data transfer combinations can be exercised within the system. Because many core plus ASIC designs contain on-chip buses, arbitration of these buses with data steering and bridging creates a significant opportunity for design errors. Therefore, typically many tests are created to ensure that the logic designs maintain data integrity. The data that is used to test the system is either manually selected or generated by a software program written by the simulation designer. The data to be used in the tasks must be generated, and synchronized, because data transfers between data sources and the data targets need not be serialized. The designer generating the data must know when and how data will be transferred within the system, before the test data are generated. This data selection process is very time consuming and error-prone. Consequently, there is a need in the art for mechanisms which allow for the automatic generation and checking of data within a hardware system simulation.

SUMMARY OF THE INVENTION

The aforementioned needs are addressed by the present invention. Accordingly, there is provided, in a first form, a simulation data verification method. The method generates a first pseudorandom data value in response to a first decoded instruction, wherein a first portion of a seed value comprises an instruction address operand of the first instruction. The first pseudorandom data value is communicated on a first data bus. A second pseudorandom data value is generated in response to a receipt of the first pseudorandom data value and the seed value; and the first and second pseudorandom data values are compared.

There is also provided, in a second form, a data processing system. The system includes circuitry operable for generating a first pseudorandom data value in response to a first decoded instruction, wherein a first portion of a seed value comprises an instruction address operand of the first instruction. Also included is circuitry operable for communicating the first pseudorandom data value on a first data bus, circuitry operable for generating a second pseudorandom data value in response to a receipt of the first data value from the communicating step and the seed value, and circuitry operable for comparing the first and second pseudorandom data values.

Additionally, there is provided, in a third form, a computer program product operable for storage on a program storage medium, the program product includes programming that generates a first pseudorandom data value in response to a first decoded instruction, wherein a first portion of a seed value comprises an instruction address operand of the first instruction. Communications programming transfers the first pseudorandom data value on a first data bus. The program product also has programming and generates a second pseudorandom data value in response to a receipt of the first data value communicated by the aforesaid programming, and the seed value, a well as programming for comparing the first and second pseudorandom data values.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A illustrate, in flow chart form, a data generation and verification methodology in accordance with an embodiment of the present invention.

DETAILED DESCRIPTION

Figure 1:
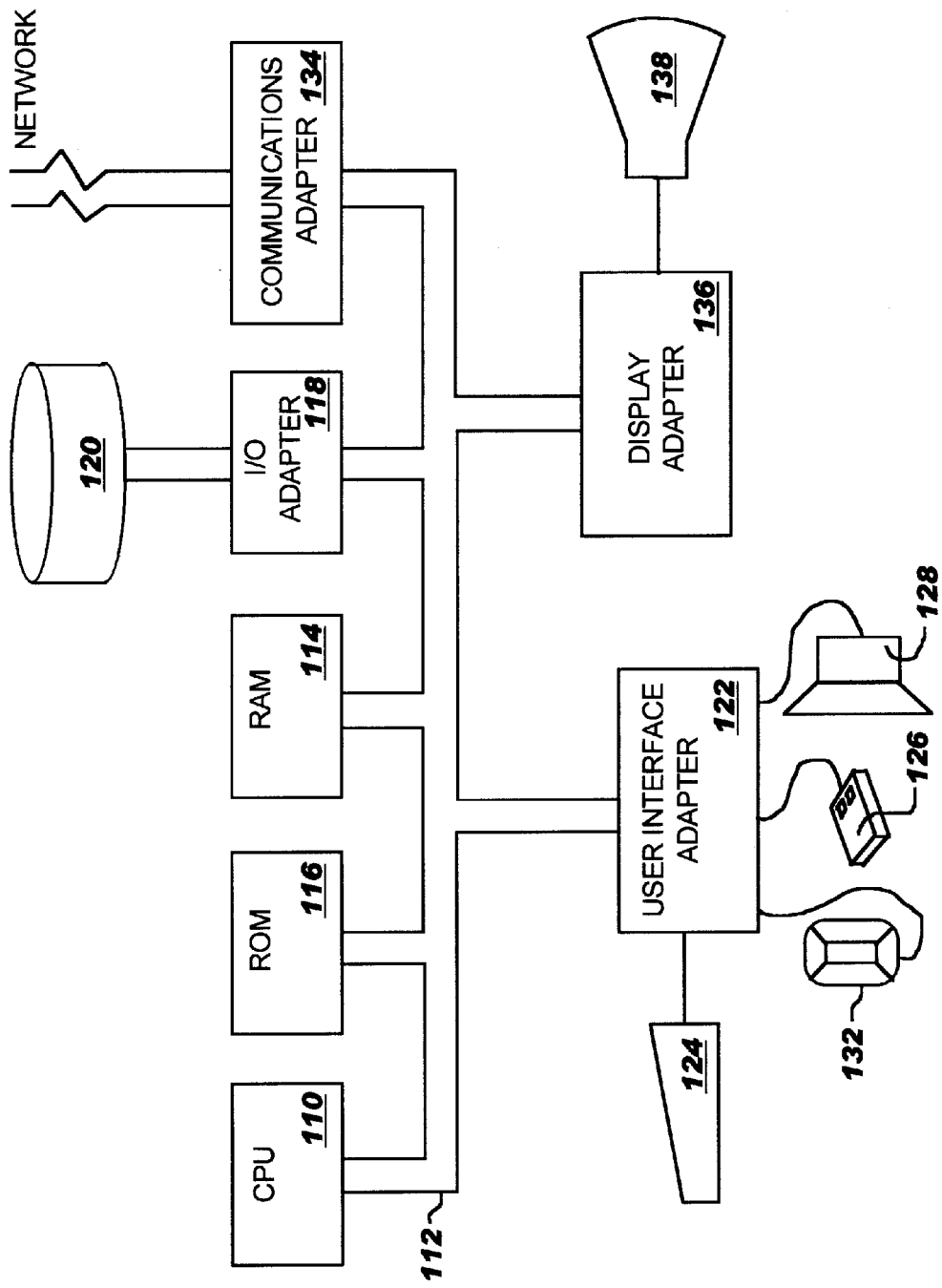
FIG. 1 illustrates, in block diagram form, a data processing system in accordance with an embodiment of the present invention.

The mechanism for automated data generation and verification in the simulation of hardware data transfers is provided. Data generation uses a pseudo-random number generator to produce both the source data to be transferred, and the expected data, which should be received in the absence of an error in the transfer. A seed input to the pseudo-random number generator includes a root portion that is preselected, and shared between all data source devices and all target devices in the system under test, and a variable portion determined from the transaction address. Thus, on receipt of a data value, the target device simulator can generate the expected value, and test the received value against the expected value to verify the integrity of the bus transaction.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, an example is shown of a data processing system 100 which may be used for the invention. The system has a central processing unit (CPU) 110, which is coupled to various other components by system bus 112. Read only memory ("ROM") 116 is coupled to the system bus 112 and includes a basic input/output system ("BIOS") that controls certain basic functions of the data processing system 100. Random access memory ("RAM") 114, I/O adapter 118, and communications adapter 134 are also coupled to the system bus 112. I/O adapter 118 may be a small computer system interface ("SCSI") adapter that communicates with a disk storage device 120. Communications adapter 134 interconnects bus 112 with an outside network enabling the data processing system to communicate with other such systems. Input/Output devices are also connected to system bus 112 via user interface adapter 122 and display adapter 136. Keyboard 124, track ball 132, mouse 126 and speaker 128 are all interconnected to bus 112 via user interface adapter 122. Display monitor 138 is connected to system bus 112 by display adapter 136. In this manner, a user is capable of inputting to the system throughout the keyboard 124, trackball 132 or mouse 126 and receiving output from the system via speaker 128 and display 138. Additionally, an operating system is used to coordinate the functions of the various components shown in FIG. 1.

Preferred implementations of the invention include implementations as a computer system programmed to execute the method or methods described herein, and as a computer program product. According to the computer system implementation, sets of instructions for executing the method or methods are resident in the random access memory 114 of one or more computer systems configured generally as described above. Until required by the computer system, the set of instructions may be stored as a computer program product in another computer memory, for example, in disk drive 120 (which may include a removable memory such as an optical disk or floppy disk for eventual use in the disk drive 120). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical, biological, or some other physical change. While it is convenient to describe the invention in terms of instructions, symbols, characters, or the like, the reader should remember that all of these and similar terms should be associated with the appropriate physical elements.

Note that the invention may describe terms such as comparing, validating, selecting, identifying, or other terms that could be associated with a human operator. However, for at least a number of the operations described herein which form part of at least one of the embodiments, no action by a human operator is desirable. The operations described are, in large part, machine operations processing electrical signals to generate other electrical signals.

Figure 2:
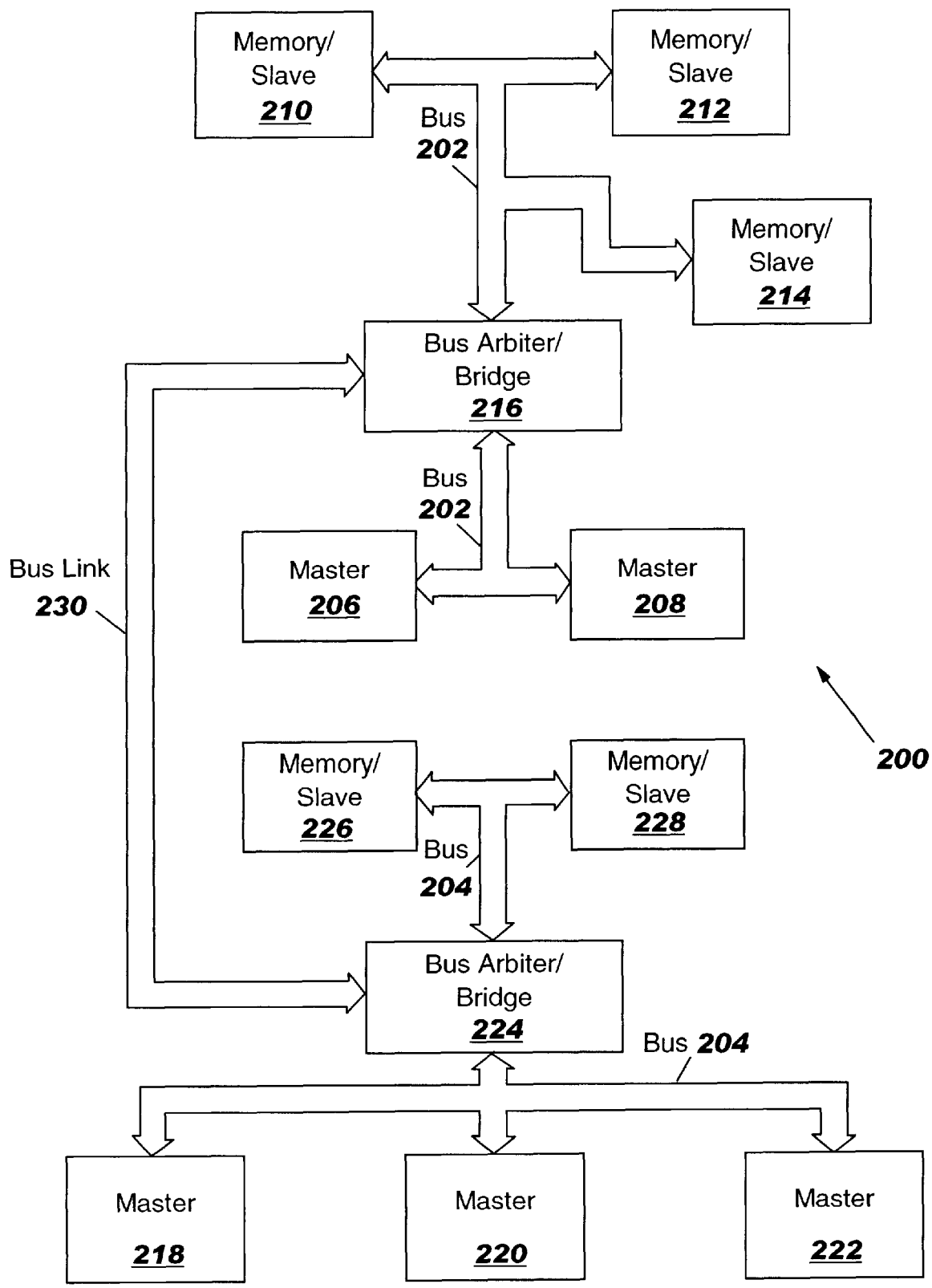
FIG. 2 illustrates, in block diagram form, an exemplary simulation architecture which may be used with the present invention.

FIG. 2 illustrates an exemplary simulation architecture 200 which may be used with the present invention. Architecture 200 includes two buses, bus 202 and bus 204. Each of buses 202 and 204 include a plurality of bus devices attached to the respective bus. Bus 202 includes two bus masters, master 206 and master 208. Bus masters are the sources of bus transaction requests. Additionally, bus 202 includes three slave devices, memory/slave 210, memory/slave 212 and memory/slave 214. Slave devices are the targets of bus transactions. Transactions in bus 202 are mediated by bus arbiter/bridge 216. Bus 204 includes three bus masters, master 218, 220, and 222. Bus transactions initiated by bus masters 218, 220 and 222 are presented by bus arbiter/bridge 224 to the targeted one of memory/slave 226 and 228 on bus 204. Additionally, bus master on bus 202 can address transactions to slaves on bus 204, and likewise, masters 218, 220, and 222 can address transactions to slaves 210, 212, and 214 on bus 202. Such transactions are mediated by the bus bridges, bus arbiter/bridge 216 and bus arbiter/bridge 224. Interbus transactions effected by bus arbiter/bridges 216 and 224 may be communicated via bus link 230. It would be understood by an artisan of ordinary skill in the art that bus link 230 may be portion of bus 202 or, in an alternative embodiment, may be a portion of bus 204. In other words, the bus arbiter/bridges may be a bus device residing on a plurality of buses. It would be further understood by an artisan of ordinary skill that exemplary architecture 200 is illustrative, and other bus architectures, depending on the device under simulation, may be used with the present invention.

Figure 3B:
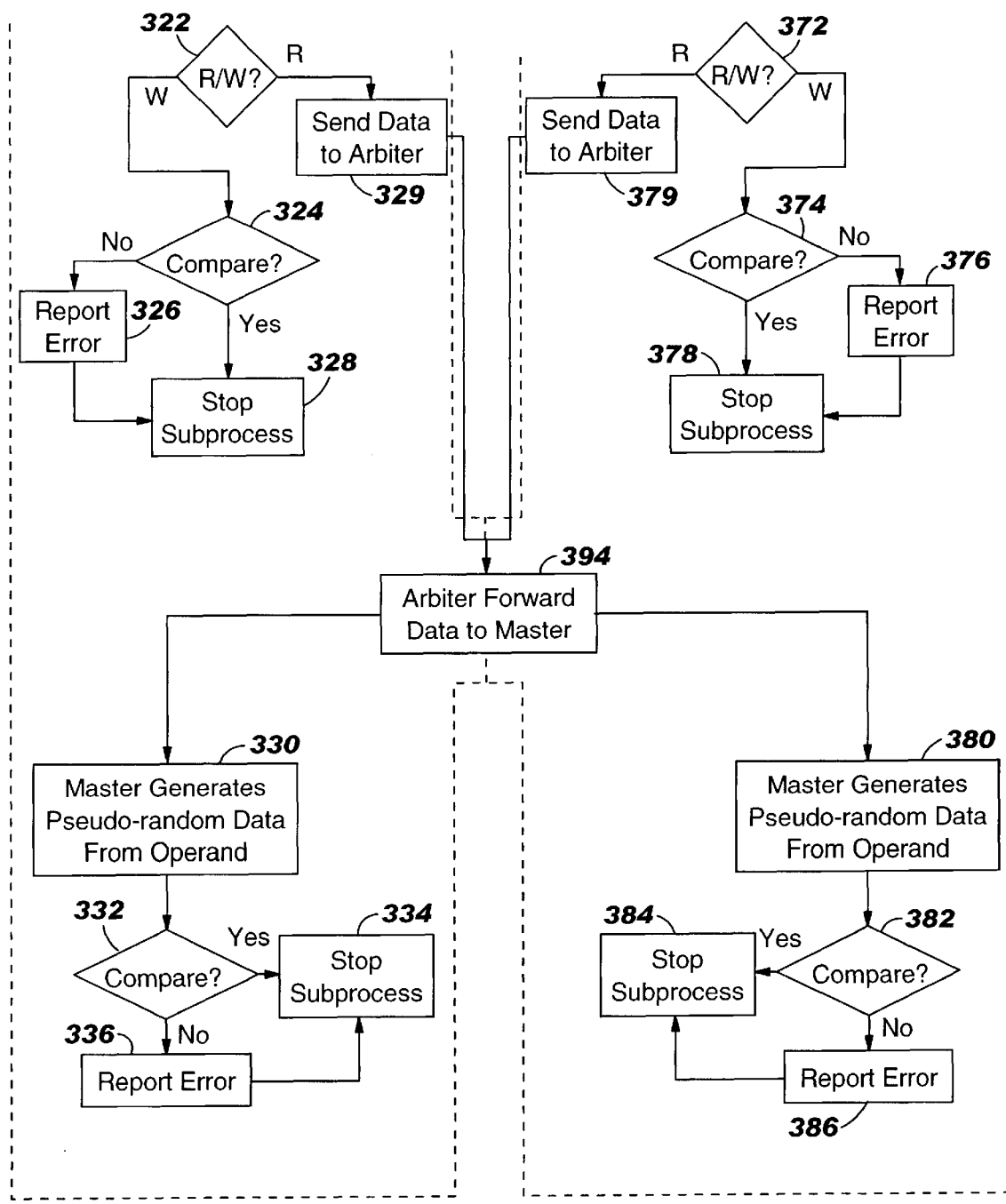
FIG. 3B illustrates, a continuation of the flow chart from FIG. 3A.

Refer now to FIG. 3A and FIG. 3B, illustrating, flow chart form, a data generation and verification mechanism 300 in accordance with an embodiment of the present invention. In step 302, a root seed value is initialized. Once selected for the case under test, the root seed remains unchanged, and is shared between all of the devices within the simulation model under test, for example, masters 206, 208, 218, 220, and 222, and slaves 210, 212, 214, 226, and 228 in FIG. 2. In step 304, it is determined if a first bus master decodes a bus transaction instruction. Step 304 may be included in a first subprocess 306. An instruction stream is generated by the test case being simulated, which includes, inter alia, a stream of instructions which may be assembly language instructions for the device being simulated in the test case. Instructions, within the instruction stream, that cause a bus master to request a bus transactions, that is, a write to, or a read from a bus source, or slave, are referred to as bus transaction instructions. Methodology 300 loops in step 304 until a first bus master decodes a bus transaction instruction.

If a first bus master decodes a bus transaction instruction, it is determined in step 310 if other bus masters exist in the simulation architecture, such as, architecture 200 in FIG. 2. Because bus masters may decode instructions asynchronously, methodology 300 may account for asynchronous bus requests by spawning a subprocess, step 390, that handles bus transactions executed asynchronously by other bus masters (A subprocess may also be referred to in the data processing art as a "thread.") Thus, if, in step 310, it is determined there are other bus masters in the system under simulation, step 390 spawns a next subprocess 308. While the first bus master continues to execute the bus transaction decoded in step 304, steps 312–336, 392 and 394 in subprocess 308, step 354 determines if another bus master decodes a bus transaction instruction. Step 354 loops until the second master decodes a bus transaction. If the second bus master decodes a bus transaction instruction in step 354, in step 360, it is determined if there are remaining bus masters which may also additional subprocesses may be spawned by returning to step 390. For simplicity, these are not shown in FIG. 3A and FIG. 3B, however, an artisan of ordinary skill in the art would understand that each new subprocess would mirror subprocesses 306 and 308. Subprocess 308 continues in steps 362–382, 392 and 394, which parallel steps 312–336, 392 and 394 in subprocess 306. Note that steps 390, 392 and 394 which will be discussed hereinbelow, are shared between subprocesses.

Returning to subprocess 306, and observing that subprocess 308 includes steps paralleling those in subprocess 306, after spawning a new subprocess in step 390, methodology 300 continues with step 312, in which it is determined if the bus transaction decoded in step 304 is a read transaction or a write transaction. If the transaction is a write transaction, the bus master generates pseudo-random data using the instruction operand decoded in step 304. The operand includes the address of the write transaction decoded in step 304. This address is logically combined with the root portion of the seed initialized in step 302 to form the seed for the pseudo-random number generator. For example, the root portion and address may be concatenated, added, subtracted, multiplied, or otherwise combined according to another predetermined logical finction to generate the seed value. Pseudo-random number generators are used in the data processing art to produce sequences of data values that satisfy a preselected set of statistical tests, which may depend on the application in which the sequence of values are being used. (See e.g., William H. Press, et al., Numerical Recipes, The Art Of Scientific Computing 191–192 (1986); Bruce Schneier, Applied Crystography, Second Edition 44–45 (1996).) Although pseudo-random number generators are designed to produce sequence of values that satisfy preselected statistical tests, they are deterministic, and for any given value of the seed, will return the same sequence of "random" numbers. Thus, in step 314, the pseudo-random data generated from the instruction operand, for the same value of root seed initialized in step 302, will generate the same pseudo-random data for the same target address in the bus transaction instruction decoded in step 304. However, for the same value of root seed, step 302, different target addresses will yield different pseudo-random data.

If, in step 312, the instruction decoded in step 304 is a read instruction, the step of generating a pseudo-random data, step 314, is bypassed. For a read instruction, the target slave device will generate the pseudo-random data, as described hereinbelow in conjunction with step 320. In step 316, the bus master initiates the transaction, by sending a read or write request, depending on the bus transaction decoded in step 304, to the bus bridge/arbiter, for example, bridge 216, or bridge 224, in FIG. 2.

In step 392, the bridge/arbiter presents the transaction on the bus. For example, the bridge/arbiter, such as bridge/arbiter 216 or 224, FIG. 2, may determine if the corresponding bus, such as bus 202 or 204, respectively, is idle. If the bus is busy, the arbiter waits until the bus is idle. Otherwise, the arbiter may sequentially loop through a predetermined list of bus masters, in which the loop wraps around after reaching a last bus master in the list. The arbiter may loop until a bus request is asserted by a master in the list. The arbiter services the first bus request, setting a bus busy state, sending the request to the target slave device, and waiting for the transaction to completes. When the transaction completes, the bus busy state is reset to indicate the bus is idle, and the arbiter continues to loop, beginning with the next master in sequence in the predetermined list of masters. In this way, each master is ensured of an opportunity before a master that has had a request granted may access the bus again. It would be understood by an artisan of ordinary skill, that in an architecture including a plurality of bridge/arbiters effecting interbus transactions, such as bus architecture 200 in FIG. 2, each of the bridge/arbiters may be bus masters for the others with respect to the common buses on which the bridge/arbiters reside. Thus in the exemplary architecture 200, FIG. 2, bridge/arbiters 216 may be a bus master in the list for bridge/arbiter 224, with respect to bus link 230, and conversely, bridge/arbiter 224 may be a master for bridge/arbiter 216. It would be further understood that in such a simulation architecture, step 392 may be performed by a first bridge sending the request to a second bridge, wherein the second bridge presents the transaction on the bus on which the target bus device resides.

As discussed hereinabove, in a system, such as exemplary system 200, in FIG. 2, having a plurality of bus masters, bus transactions may be deserialized, as exemplified by subprocesses 306 and 308. The second bus master also initiate a transaction, in step 366, which parallels step 316 in subprocess 306, via the bus bridge/arbiter, in step 392. The bridge/arbiter presents the transactions initiated in steps 316 and 366 to the system in accordance with the simulation model of the bride/arbiter in the system under test. That is, the asynchronous bus transactions are presented to the system in accordance with arbitration rules implemented in the design of the bridge/arbiter in the system under simulation.

In step 318, subprocess 306, the slave device corresponding to the target address decoded in step 302 claims the transaction. Similarly, in step 368, subprocess 308, the corresponding slave claims the transaction initiated by the second bus master corresponding to the address decoded in step 354. Hereafter, the description will be restricted to subprocess 306, however, parallel steps are also executed in subprocess 308 as indicated in FIGS. 3A and 3B.

In step 320, the slave generates the pseudo-random data using the root seed from initialization step 302, and the slave address, which corresponds to the address decoded in step 304 to form the seed passed to the pseudo-random number generator. In step 322, it is determined if the transaction is a read transaction or a write transaction. If a write transaction, in step 324, the pseudo-random data value generated in step 320 is compared with the data value written to the slave device. If the data values do not compare, then an error has occurred in the simulation of the bus transaction, and the compare failure is reported in step 336. The subprocess is terminated in step 334. If, however, no error has occurred, and the pseudo-random data value generated in step 320 compares with the data written to the slave device through the write transaction, then the subprocess is terminated in step 334. The parallel process occurs in subprocess 308 for the bus transaction initiated by the second bus master, in steps 370–378.

Returning to subprocess 306, if, in step 322, a read transaction has been initiated in response to the instruction decoded in step 304, the slave sends the pseudo-random data generated in step 320 to the bridge/arbiter, step 329. In step 329, the bridge/arbiter forwards the data to the bus master initiating the transaction. In step 330, the bus master generates the pseudo-random data value using the root seed initialized in step 302, and the slave address decoded in step 304. Because the operand address of the target slave is the same as the address used by the slave to generate the pseudo-random data in step 320, the value generated in step 330 is the same as the value generated in step 320. In step 332, the master compares the pseudo-random data value generated in step 330 with the value forwarded by the bridge/arbiter in step 329. If the compare fails, an error in the bus transaction as occurred, and the compare failure is reported in step 336. The subprocess is then terminated in step 334. If, however, no error in the bus transaction simulation has occurred, the pseudo-random data value generated in step 330 will be the same as the value received by the bus master from the arbiter in step 394, and the subprocess is terminated without reporting an error, in step 334.

Because of the asynchronous execution of bus transactions, as previously described, the arbiter may also receive read data from a slave device in subprocess 308. The arbiter will forward data to the respective bus masters in accordance with arbitration rules implemented in the hardware under simulation. The second bus master will generate a corresponding pseudo-random data value in step 380, which, subprocess 308, which parallels step 330 in subprocess 306. Subprocess 308 then executes steps 382–386 which parallels steps 332–336 in subprocess 306.

In this way, automatic data generation in test simulations of a data processing system may be generated. Because expected values are generated by the endpoint bus device, "on the fly," the test designer need not know when and how the data will be transferred within the system before the tests are generated, to account for deserialized bus transactions.

Although the present invention and its advantages have been described in detail, it should be understood that various changes, substitutions and alterations can be made herein without departing from the spirit and scope of the invention as defined by the appended claims.

What is claimed is:

1. A simulation data verification method comprising the steps of:
   (A) generating a first pseudorandom data value at a first device in response to a first decoded instruction, wherein said first pseudorandom data value is seeded by a pseudorandom data generator initialization request comprising a seed value, the initialization request originating from the first device, and wherein a first portion of the seed value comprises an instruction address operand of said first instruction;
   (B) communicating said first pseudorandom data value to a second device coupled through a first data bus producing a communicated data value at the second device;
   (C) generating a second pseudorandom data value at the second device in response to the receipt of the communicated data value, wherein said second pseudorandom data value is seeded by a pseudorandom data generator re-initialization request comprising the seed value of said generating step (A), the re-initialization request originating from the second device, wherein the second pseudorandom data value is not communicated over said first data bus and whereby the first and second pseudorandom data values produced by said generating steps (A) and (C) are the same value; and
   (D) comparing the communicated data value and said second pseudorandom data value.

2. The method of claim 1 further comprising the step of providing a root portion of said seed value, and wherein said root portion and said first portion form said seed value.

3. The method of claim 1 wherein said step of generating said first pseudorandom data value comprises the step of providing said seed value to a predetermined pseudorandom number generator.

4. The method of claim 1 further comprising the step of outputting an error message in response to a miscompare in said comparing step (D).

5. The method of claim 1 wherein said first encoded instruction comprises a write instruction and said step of generating said first pseudorandom data value is executed by a first simulated bus master.

6. The method of claim 5 wherein said step of communicating said first pseudorandom data value comprises the steps of:
   sending a write request to a first bus arbiter by said first bus master;
   sending said first pseudorandom data value to said first bus arbiter, wherein said first bus arbiter presents said pseudorandom data on said first data bus; and
   receiving said first pseudorandom data value by a target bus device corresponding to said operand address.

7. The method of claim 1 wherein said first decoded instruction comprises a read instruction, and said step of generating said first pseudorandom data value is executed by a simulated first bus slave device.

8. The method of claim 7 wherein said step of communicating said first pseudorandom data value comprises the steps of:
   sending a read request to a first bus arbiter by a first bus master, wherein said first bus arbiter presents said read request on said first data bus;
   receiving said read request by a first slave device corresponding to said operand address;
   sending said first pseudorandom data value to said first bus arbiter; and
   receiving said first pseudorandom data value by said first bus master.

9. The method of claim 8 wherein said step of generating said second pseudorandom data value is executed by said first simulated bus master.

10. The method of claim 1 further comprising the step of sending a first bus request to a first simulated bus arbiter by a first simulated bus master in response to said first decoded instruction, wherein said first bus arbiter communicates said bus request on said first data bus.

11. The method of claim 10 further comprising the steps of:
   receiving said bus request by a second simulated bus arbiter; and
   presenting said bus request on a second data bus by said second bus arbiter, wherein said first and second pseudorandom data values are generated in response to said first bus request.

12. A simulation data verification method comprising the steps of:

generating a first pseudorandom data value in response to a first decoded instruction, wherein a first portion of a seed value comprises an instruction address operand of said first instruction;

communicating said first pseudorandom data value on a first data bus;

generating a second pseudorandom data value in response to a receipt of said first data value from said communicating step and said seed value; and comparing said first and second pseudorandom data values;

wherein said first decoded instruction comprises a write instruction and said step of generating said first pseudorandom data value is executed by a first simulated bus master, and wherein said step of communicating said first pseudorandom data value comprises the steps of:

sending a write request to a first bus arbiter by said first bus master;

sending said first pseudorandom data value to said first bus arbiter, wherein said first bus arbiter presents said pseudorandom data on said first data bus; and receiving said first pseudorandom data value by a target bus device corresponding to said operand address;

and wherein said step of generating said second pseudorandom data value is executed by said first simulated slave device.

13. A simulation data verification method comprising the steps of:

generating a first pseudorandom data value in response to a first decoded instruction, wherein a first portion of a seed value comprises an instruction address operand of said first instruction;

communicating said first pseudorandom data value on a first data bus;

generating a second pseudorandom data value in response to a receipt of said first data value from said communicating step and said seed value;

comparing said first and second pseudorandom data values;

sending a first bus request to a first simulated bus arbiter by a first simulated bus master in response to said first decoded instruction, wherein said first bus arbiter communicates said bus request on said first data bus;

sending a second bus request to said first bus arbiter by a second simulated bus master in response to a second decoded instruction;

communicating said second bus request on said first bus by said bus arbiter, wherein said arbiter communicates said first and second requests in response to a predetermined bus arbitration protocol;

generating third and fourth pseudorandom data values in response to said second bus request, wherein said third and fourth pseudorandom data values are generated using a seed data value including a portion comprising an instruction address operand of said second instruction; and comparing said second and third pseudorandom data values.

14. A data processing system comprising:

(A) circuitry operable for generating a first pseudorandom data value at a first device in response to a first decoded instruction, wherein said first pseudorandom data value is seeded by a pseudorandom data generator initialization request comprising a seed value, the initialization request originating from the first device, and wherein a first portion of a seed value comprises an instruction address operand of said first instruction;

(B) circuitry operable for communicating said first pseudorandom data value to a second device coupled through a first data bus producing a communicated data value at the second device;

(C) circuitry operable for generating a second pseudorandom data value at the second device in response to the receipt of the communicated data value, wherein said second pseudorandom data value is seeded by a pseudorandom data generator re-initialization request comprising the seed value of said circuitry operable for generating (A), the re-initialization request originating from the second device, wherein the second pseudorandom data value is not communicated over said first data bus and whereby the first and second pseudorandom data values produced by said circuits (A) and (C) are the same value; and (D) circuitry operable for comparing the communicated data value and said second pseudorandom data value.

15. The data processing system of claim 14 further comprising circuitry operable for providing a root portion of said seed value, and wherein said root portion and said first portion form said seed value.

16. The data processing system of claim 14 wherein said circuitry operable for generating said first pseudorandom data value comprises circuitry operable for providing said seed value to a predetermined pseudorandom number generator.

17. The data processing system of claim 14 further comprising circuitry operable for outputting an error message in response to a miscompare in said circuitry (D).

18. The data processing system of claim 14 wherein said first encoded instruction comprises a write instruction and said step of generating said first pseudorandom data value is executed by a first simulated bus master.

19. The data processing system of claim 18 wherein said circuitry operable for communicating said first pseudorandom data value comprises:

circuitry operable for sending a write request to a first bus arbiter by said first bus master;

circuitry operable for sending said first pseudorandom data value to said first bus arbiter, wherein said first bus arbiter presents said pseudorandom data on said first data bus; and circuitry operable for receiving said first pseudorandom data value by a target bus device corresponding to said operand address.

20. The data processing system of claim 14 wherein said first decoded instruction comprises a read instruction, and said circuitry operable for generating said first pseudorandom data value is executed by a simulated first bus slave device.

21. The data processing system of claim 20 wherein said circuitry operable for communicating said first pseudorandom data value comprises:

circuitry operable for sending a read request to a first bus arbiter by a first bus master, wherein said first bus arbiter presents said read request on said first data bus;

circuitry operable for receiving said read request by a first slave device corresponding to said operand address;

circuitry operable for sending said first pseudorandom data value to said first bus arbiter; and circuitry operable for receiving said first pseudorandom data value by said first bus master.

22. The data processing system of claim 21 wherein said circuitry operable for generating said second pseudorandom data value is executed by said first simulated bus master.

23. The data processing system of claim 14 further comprising circuitry operable for sending a first bus request to a first simulated bus arbiter by a first simulated bus master in response to said first decoded instruction, wherein said first bus arbiter communicates said bus request on said first data bus.

24. The data processing system of claim 23 further comprising:
    circuitry operable for receiving said bus request by a second simulated bus arbiter; and
    circuitry operable for presenting said bus request on a second data bus by said second bus arbiter, wherein said first and second pseudorandom data values are generated in response to said first bus request.

25. A data processing system comprising:
    circuitry operable for generating a first pseudorandom data value in response to a first decoded instruction, wherein a first portion of a seed value comprises an instruction address operand of said first instruction;
    circuitry operable for communicating said first pseudorandom data value on a first data bus;
    circuitry operable for generating a second pseudorandom data value in response to a receipt of said first data value from said communicating step and said seed value; and
    circuitry operable for comparing said first and second pseudorandom data values;
wherein said first decoded instruction comprises a read instruction, and said circuitry operable for generating said first pseudorandom data value is executed by a simulated first bus slave device;
and wherein said circuitry operable for generating said second pseudorandom data value is executed by said first simulated slave device.

26. A data processing system comprising:
    circuitry operable for generating a first pseudorandom data value in response to a first decoded instruction, wherein a first portion of a seed value comprises an instruction address operand of said first instruction;
    circuitry operable for communicating said first pseudorandom data value on a first data bus;
    circuitry operable for generating a second pseudorandom data value in response to a receipt of said first data value from said communicating step and said seed value;
    circuitry operable for comparing said first and second pseudorandom data values;
    circuitry operable for sending a first bus request to a first simulated bus arbiter by a first simulated bus master in response to said first decoded instruction, wherein said first bus arbiter communicates said bus request on said first data bus;
    circuitry operable for sending a second bus request to said first bus arbiter by a second simulated bus master in response to a second decoded instruction;
    circuitry operable for communicating said second bus request on said first bus by said bus arbiter, wherein said arbiter communicates said first and second requests in response to a predetermined bus arbitration protocol;
    circuitry operable for generating third and fourth pseudorandom data values in response to said second bus request, wherein said third and fourth pseudorandom data values are generated using a seed data value including a portion comprising an instruction address operand of said second instruction; and
    circuitry operable for comparing said second and third pseudorandom data values.

27. A computer program product operable for storing on storage media, the program product including programming operable for simulation data verification, the program product comprising:
    (A) programming for generating a first pseudorandom data value at a first device in response to a first decoded instruction, wherein said first pseudorandom data value is seeded by a pseudorandom data generator initialization request comprising a seed value, the initialization request originating from the first device, and wherein a first portion of a seed value comprises an instruction address operand of said first instruction;
    (B) programming for communicating said first pseudorandom data value to a second device coupled through a first data bus producing a communicated data value at the second device;
    (C) programming for generating a second pseudorandom data value at the second device in response to the receipt of the communicated data value, wherein said second pseudorandom data value is seeded by a pseudorandom data generator re-initialization request comprising the seed value of said circuitry operable for generating (A), the re-initialization request originating from the second device, wherein the second pseudorandom data value is not communicated over said first data bus and whereby the first and second pseudorandom data values produced by said programming (A) and (C) are the same value; and
    (D) programming for comparing the communicated data value and said second pseudorandom data value.

28. The program product of claim 27 further comprising programming for providing a root portion of said seed value, and wherein said root portion and said first portion form said seed value.

29. The program product of claim 27 wherein said programming for generating said first pseudorandom data value comprises circuitry operable for providing said seed value to a predetermined pseudorandom number generator.

30. The program product of claim 27 further comprising programming for outputting an error message in response to a miscompare in said programming (D).

31. The program product of claim 27 wherein said first encoded instruction comprises a write instruction and said programming for generating said first pseudorandom data value is executed by a first simulated bus master.

32. The program product of claim 31 wherein said programming for communicating said first pseudorandom data value comprises:
    programming for sending a write request to a first bus arbiter by said first bus master;
    programming for sending said first pseudorandom data value to said first bus arbiter, wherein said first bus arbiter presents said pseudorandom data on said first data bus; and
    programming for receiving said first pseudorandom data value by a target bus device corresponding to said operand address.

33. The program product of claim 27 wherein said first decoded instruction comprises a read instruction, and said circuitry operable for generating said first pseudorandom data value is executed by a simulated first bus slave device.

34. The program product of claim 33 wherein said programming for communicating said first pseudorandom data value comprises:

programming for sending a read request to a first bus arbiter by a first bus master, wherein said first bus arbiter presents said read request on said first data bus;

programming for receiving said read request by a first slave device corresponding to said operand address;

programming for sending said first pseudorandom data value to said first bus arbiter; and programming for receiving said first pseudorandom data value by said first bus master.

35. The program product of claim 34 wherein said programming for generating said second pseudorandom data value is executed by said first simulated bus master.

36. The program product of claim 27 further comprising programming for sending a first bus request to a first simulated bus arbiter by a first simulated bus master in response to said first decoded instruction, wherein said first bus arbiter communicates said bus request on said first data bus.

37. The program product of claim 36 further comprising:

programming for receiving said bus request by a second simulated bus arbiter; and programming for presenting said bus request on a second data bus by said second bus arbiter, wherein said first and second pseudorandom data values are generated in response to said first bus request.

38. A computer program product operable for storing on storage media, the program product including programming operable for simulation data verification, the program product comprising:

programming for generating a first pseudorandom data value in response to a first decoded instruction, wherein a first portion of a seed value comprises an instruction address operand of said first instruction;

programming for communicating said first pseudorandom data value on a first data bus;

programming for generating a second pseudorandom data value in response to a receipt of said first data value from said communicating step and said seed value; and programming for comparing said first and second pseudorandom data values;

wherein said first decoded instruction comprises a read instruction, and said programming operable for generating said first pseudorandom data value is executed by a simulated first bus slave device;

and wherein said programming for generating said second pseudorandom data value is executed by said first simulated slave device.

39. A computer program product operable for storing on storage media, the program product including programming operable for simulation data verification, the program product comprising:

programming for generating a first pseudorandom data value in response to a first decoded instruction, wherein a first portion of a seed value comprises an instruction address operand of said first instruction;

programming for communicating said first pseudorandom data value on a first data bus;

programming for generating a second pseudorandom data value in response to a receipt of said first data value from said communicating step and said seed value;

programming for comparing said first and second pseudorandom data values;

programming for sending a first bus request to a first simulated bus arbiter by a first simulated bus master in response to said first decoded instruction, wherein said first bus arbiter communicates said bus request on said first data bus;

programming for sending a second bus request to said first bus arbiter by a second simulated bus master in response to a second decoded instruction;

programming for communicating said second bus request on said first bus by said bus arbiter, wherein said arbiter communicates said first and second requests in response to a predetermined bus arbitration protocol;

programming for generating third and fourth pseudorandom data values in response to said second bus request, wherein said third and fourth pseudorandom data values are generated using a seed data value including a portion comprising an instruction address operand of said second instruction; and programming for comparing said second and third pseudorandom data values.

40. A process for simulating electronics comprising:

(A) generating a first pseudorandom data value at a first device in response to a first decoded instruction, wherein said first pseudorandom data value is seeded by a pseudorandom data generator initialization request comprising a seed value, the initialization request originating from the first device, and wherein a first portion of the seed value comprises an instruction address operand of said first instruction;

(B) communicating said first pseudorandom data value to a second device coupled through a first data bus producing a communicated data value at the second device;

(C) generating a second pseudorandom data value at the second device in response to the receipt of the communicated data value, wherein said second pseudorandom data value is seeded by a pseudorandom data generator re-initialization request comprising the seed value of said generating step (A), the re-initialization request originating from the second device; and (D) comparing the communicated data value and said second pseudorandom data value;

whereby the second pseudorandom data value is not communicated over said first data bus, and whereby the first and second pseudorandom data values produced by said generating steps (A) and (C) are the same value.

* * * * *